(12) United States Patent
Kuno et al.

(10) Patent No.: US 7,608,214 B2
(45) Date of Patent: Oct. 27, 2009

(54) LASER BEAM MACHINING METHOD

(75) Inventors: Koji Kuno, Hamamatsu (JP); Tatsuya Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/665,263

(22) PCT Filed: Oct. 5, 2005

(86) PCT No.: PCT/JP2005/018464

§ 371 (c)(1),
(2), (4) Date: May 12, 2008

(87) PCT Pub. No.: WO2006/040984

PCT Pub. Date: Apr. 20, 2006

(65) Prior Publication Data

US 2009/0039559 A1  Feb. 12, 2009

(30) Foreign Application Priority Data

Oct. 13, 2004 (JP) ............................. 2004-299193

(51) Int. Cl.
*H01L 21/268* (2006.01)
(52) U.S. Cl. ..................................... 264/400
(58) Field of Classification Search ................. 264/400
See application file for complete search history.

(56) References Cited

U.S. PATENT DOCUMENTS 6,992,026 B2  1/2006 Fukuyo et al.

(Continued)

FOREIGN PATENT DOCUMENTS

EP  1 595 637  11/2005

(Continued)

OTHER PUBLICATIONS

K. Arai, "Laser dicing process for Si wafer," Journal of the Japan Society for Abrasive Technology, vol. 47, No. 5, May 2003, pp. 229-231 (w/English language translation).

(Continued)

*Primary Examiner*—Philip C Tucker
*Assistant Examiner*—Robert J Grun
(74) *Attorney, Agent, or Firm*—Drinker Biddle & Reath LLP

(57) ABSTRACT

To provide a laser processing method which can highly accurately cut a planar object to be processed having an irregular surface as an entrance surface for processing laser light.

This laser processing method irradiates a planar object to be processed with laser light while locating a light-converging point within the object, thereby forming modified regions 71 to 77 to become a starting point region for cutting along lines to cut 5. The entrance surface r for the laser light in the object is an irregular surface. The lines to cut 5 extend over a depressed area surface r2 and a protruded area surface r1 in the entrance surface r. The modified region 71 is formed inside by a predetermined distance from the depressed area surface r2. At the time of irradiation with laser light along a part 51*a* on the protruded area surface r1, the light-converging point is located on the outside of the object. The modified region 72 is formed inside by a predetermined distance from the protruded area surface r1. At the time of irradiation with laser light along a part 51*b* on the depressed area surface r2, the light-converging point is located on the outside of the object.

9 Claims, 19 Drawing Sheets (a)

(b)

U.S. PATENT DOCUMENTS

2004/0002199 A1  1/2004  Fukuyo et al.
2006/0144828 A1* 7/2006  Fukumitsu et al. ..... 219/121.67

FOREIGN PATENT DOCUMENTS

| EP | 1 707 298 | 10/2006 | | |
|---|---|---|---|---|
| EP | 1 712 322 | 10/2006 | | |
| EP | 1 716 960 | 11/2006 | | |
| JP | 2002-192371 | 7/2002 | | |
| JP | 2002-219591 | 8/2002 | | |
| JP | 2003-266185 | 9/2003 | | |
| WO | WO-2004/052586 | * | 6/2004 | ............ 219/121.67 |
| WO | WO 2004/052586 | 6/2004 | | |
| WO | WO 2005/065880 | 7/2005 | | |
| WO | WO 2005/065881 | 7/2005 | | |
| WO | WO 2005/065882 | 7/2005 | | |

OTHER PUBLICATIONS

K. Hayashi; "Inner Glass Marking by Harmonics of Solid-State Laser", Proceedings of 45$^{th}$ Laser Materials Processing Conference, Dec. 1998, pp. 23-28.

K. Miura et al., "Formation of Photo-Induced Structures in Glasses with Femtosecond Laser", Proceedings of 42$^{nd}$ Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

* cited by examiner

Fig.18
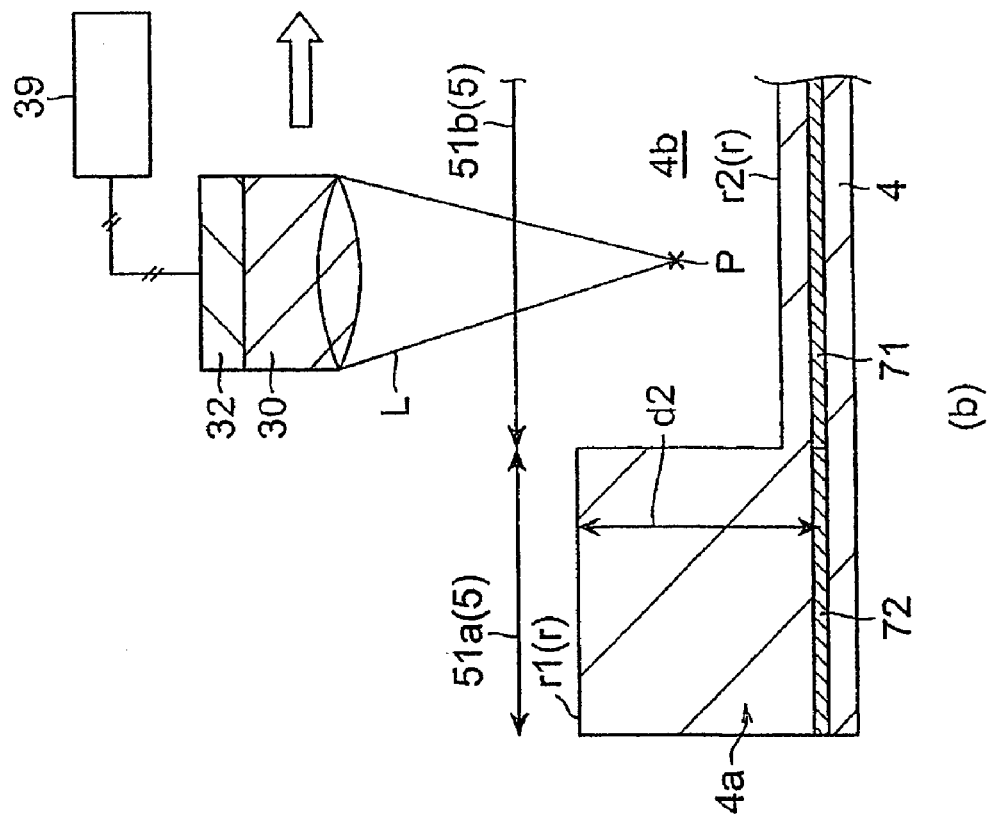
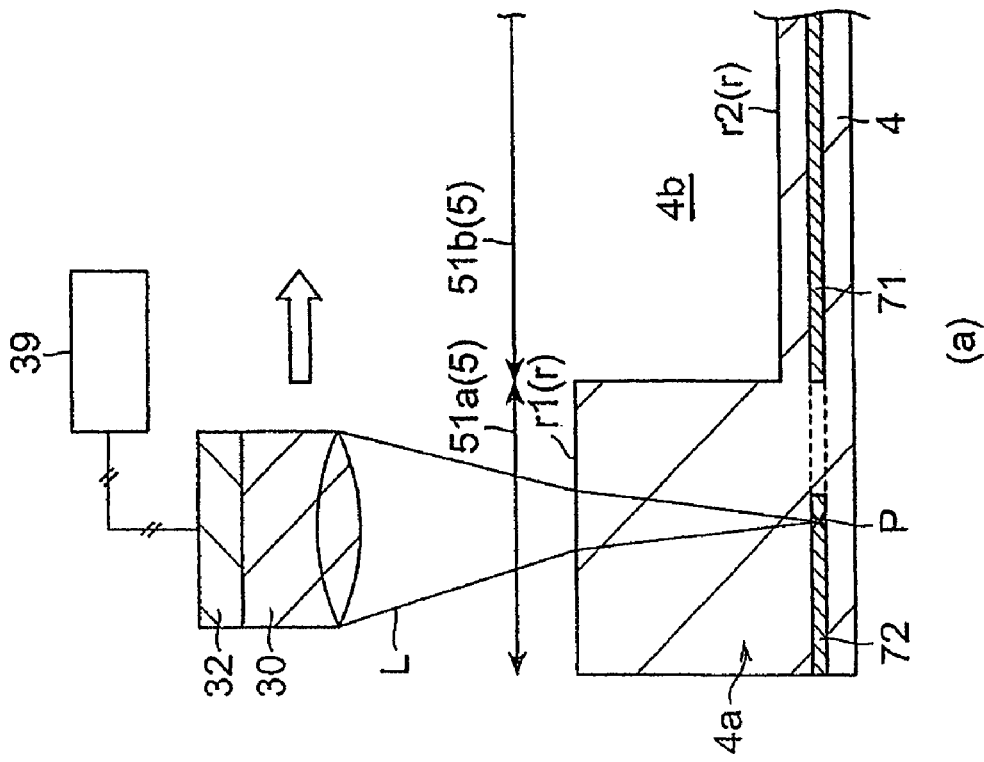

LASER BEAM MACHINING METHOD

TECHNICAL FIELD

The present invention relates to a laser processing method used for cutting a planar object to be processed.

BACKGROUND ART

Known as a method of cutting an object to be processed by laser processing is one disclosed in the following Nonpatent Document 1. The laser processing method disclosed in Nonpatent Document 1 is one for cutting a silicon wafer, which uses laser light having a wavelength near 1 µm transmittable through silicon and converges this laser light within the wafer, so as to continuously form a modified layer, from which the wafer is cut.

Nonpatent Document 1: Arai, Kazuhisa, "Laser dicing process for Si wafer", Journal of the Japan Society for Abrasive Technology, Vol. 47, No. 5, May, 2003, 229-231.

DISCLOSURE OF THE INVENTION

Problem to be Solved by the Invention

When a laser processing method such as the one mentioned above is used for forming a modified region within a planar object to be processed having an irregular surface as an entrance surface for processing laser light, there are cases where the modified region is not formed highly accurately inside by a predetermined distance from the entrance surface. In such a case, the accuracy of cutting the object decreases.

In view of such circumstances, it is an object of the present invention to provide a laser cutting method which can highly accurately cut a planar object to be processed having an irregular surface as an entrance surface for processing laser light.

Means for Solving Problem

For overcoming the problem mentioned above, the present invention provides a laser processing method of irradiating a planar object to be processed with processing laser light while locating a light-converging point within the object so as to form a modified region to become a starting point region for cutting within the object along a line to cut the object; the method comprising, when an entrance surface of the processing laser light in the object is an irregular surface while the line to cut extends over a depressed area surface and a protruded area surface in the entrance surface, a first step of forming a first modified region inside by a predetermined distance from the depressed area surface along the line to cut; and a second step of forming a second modified region inside by a predetermined distance from the protruded area surface along the line to cut; wherein, in the first step, the light-converging point is located outside the object at the time of irradiation with the processing laser light along a part on the protruded area surface in the line to cut; and wherein, in the second step, the light-converging point is located outside the object at the time of irradiation with the processing laser light along a part on the depressed area surface in the line to cut.

The laser processing method of the present invention forms first and second modified regions inside by predetermined distances from depressed and protruded area surfaces of the entrance surface for the processing laser light in steps different from each other, respectively. Therefore, even when the line to cut extends over the depressed and protruded area surfaces of the entrance surface, the first modified region can be formed highly accurately inside by a predetermined distance from the depressed area surface in the first step, and the second modified region can be formed highly accurately inside by a predetermined distance from the protruded area surface in the second step. Consequently, the laser processing method of the present invention can highly accurately cut a planar object to be processed having an irregular surface as an entrance surface for the processing laser light.

The predetermined distance between the depressed area surface and the first modified region and the predetermined distance between the protruded area surface and the second modified region may be either identical or different from each other. The order of performing the first and second steps is not restricted in particular. For example, the second step may be performed after the first step or vice versa.

Preferably, in the first step, an irradiation condition of the processing laser light is changed so as to position the light-converging point of the processing laser light inside by a predetermined distance from the depressed area surface at the time of irradiation with the processing laser light along a part on the depressed area surface in the line to cut, and is fixed at the time of irradiation with the processing laser light along a part on the protruded area surface in the line to cut; whereas, in the second step, the irradiation condition of the processing laser light is changed so as to position the light-converging point of the processing laser light inside by a predetermined distance from the protruded area surface at the time of irradiation with the processing laser light along a part on the protruded area surface in the line to cut, and is fixed at the time of irradiation with the processing laser light along a part on the depressed area surface in the line to cut.

In this case, at the time of irradiation with the processing laser light along a part on the depressed area surface on the line to cut in the first step, the position of light-converging point of processing laser light can follow the displacement of the entrance surface (e.g., irregularities and undulations in the entrance surface) in the thickness direction of the object. Also, at the time of irradiation with the processing laser light along a part on the protruded area surface in the line to cut in the first step, the light-converging point of the processing laser light can reliably be positioned outside the object. Similarly, at the time of irradiation with the processing laser light along a part on the protruded area surface in the line to cut in the second step, the position of light-converging point of processing laser light can follow the displacement of the entrance surface (e.g., irregularities and undulations in the entrance surface) in the thickness direction of the object. Also, at the time of irradiation with the processing laser light along a part on the depressed area surface in the line to cut in the second step, the light-converging point of the processing laser light can reliably be positioned outside the object.

Preferably, after forming the first and second modified regions, the object is cut along the line to cut. This can highly accurately cut the object along the line to cut.

Effect of the Invention

The present invention can provide a laser processing method which enables highly accurate cutting of a planar object to be processed having an irregular surface as an entrance surface for processing laser light.

BRIEF DESCRIPTION OF THE DRAWINGS

FIG. 18 is a partial sectional view of the object in a second step of the laser processing method in accordance with the embodiment.

EXPLANATIONS OF NUMERALS OR LETTERS

1 . . . object to be processed; 5 . . . line to cut; 51a . . . part on a protruded area surface in lines to cut; 51b . . . part on a depressed area surface in lines to cut; 7 . . . modified region; 71 . . . first modified region; 72 . . . second modified region; r . . . entrance surface; r1 . . . protruded area surface of the entrance surface; r2 . . . depressed area surface of the entrance surface; L . . . processing laser light; P . . . light-converging point.

BEST MODES FOR CARRYING OUT THE INVENTION

In the following, a preferred embodiment of the present invention will be explained in detail with reference to the drawings. The laser processing method in accordance with this embodiment utilizes a phenomenon of multiphoton absorption in order to form a modified region within an object to be processed. Therefore, a laser processing method for forming a modified region by the multiphoton absorption will be explained first.

A material becomes optically transparent when its absorption bandgap $E_G$ is greater than photon energy hv. Hence, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at a light-converging point. The multiphoton absorption occurs under a condition where the peak power density is 1×10$^8$ (W/cm$^2$) or greater, for example. The peak power density is determined by (energy of laser light at the light-converging point per pulse)/(beam spot cross-sectional area of laser light×pulse width). In the case of continuous waves, the intensity of laser light is determined by the field intensity (W/cm$^2$) of laser light at the light-converging point.

Figure 1:
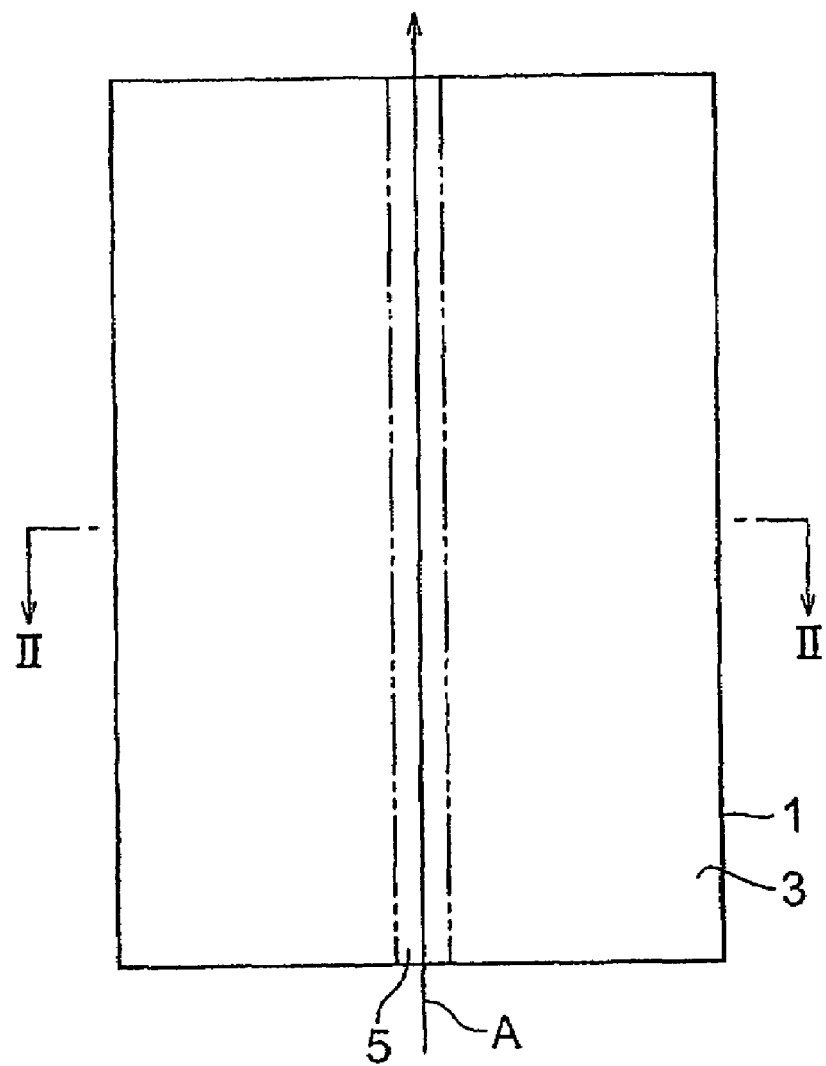
FIG. 1 is a plan view of an object to be processed during laser processing by the laser processing method in accordance with an embodiment.
Figure 2:
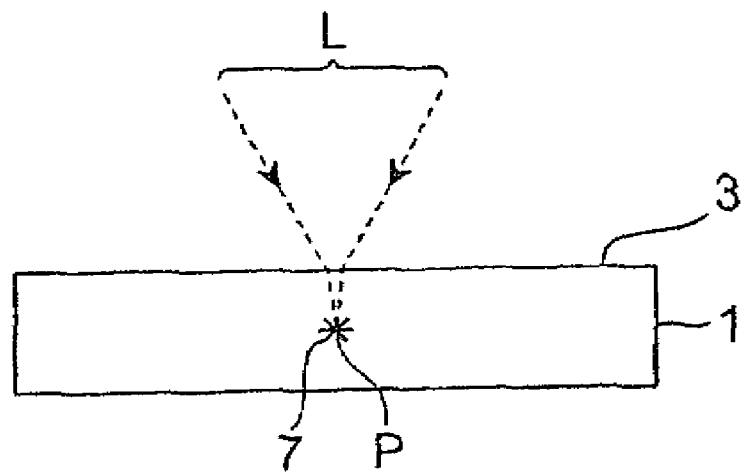
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a light-converging point P within the object 1 under a condition generating multiphoton absorption, so as to form a modified region 7. The light-converging point P is a position at which the laser light L is converged. The line to cut 5 may be curved instead of being straight, and may be a line actually drawn on the object 1 without being restricted to virtual lines.

Figure 3:
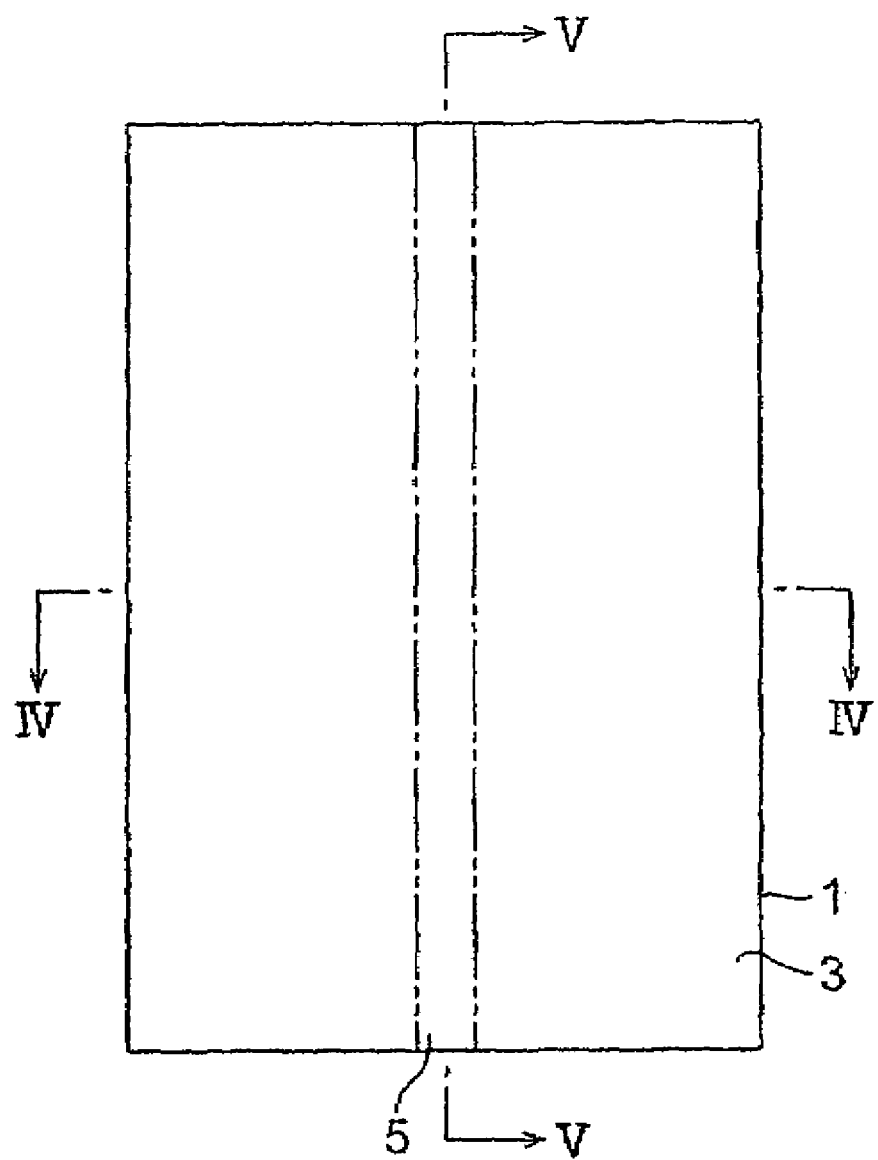
FIG. 3 is a plan view of the object after the laser processing by the laser processing method in accordance with the embodiment.
Figure 4:
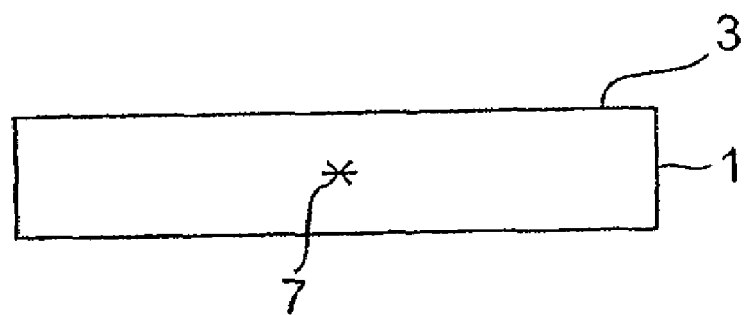
FIG. 4 is a sectional view of the object taken along the line IV-IV of FIG. 3.
Figure 5:
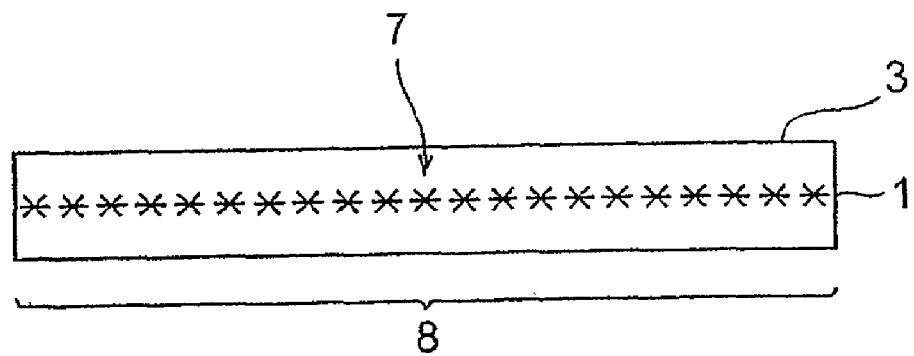
FIG. 5 is a sectional view of the object taken along the line V-V of FIG. 3.

The laser light L is relatively moved along the line to cut 5 (i.e., in the direction of arrow A in FIG. 1), so as to shift the light-converging point P along the line to cut 5. Consequently, as shown in FIGS. 3 to 5, the modified region 7 is formed within the object 1 along the line to cut 5, whereas a starting point region for cutting 8 is formed by the modified region 7. Here, the starting point region for cutting 8 refers to a region which becomes a start point for cutting (fracturing) at the time when the object 1 is cut. The starting point region for cutting 8 may be made by the modified region 7 formed continuously or modified regions 7 formed intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
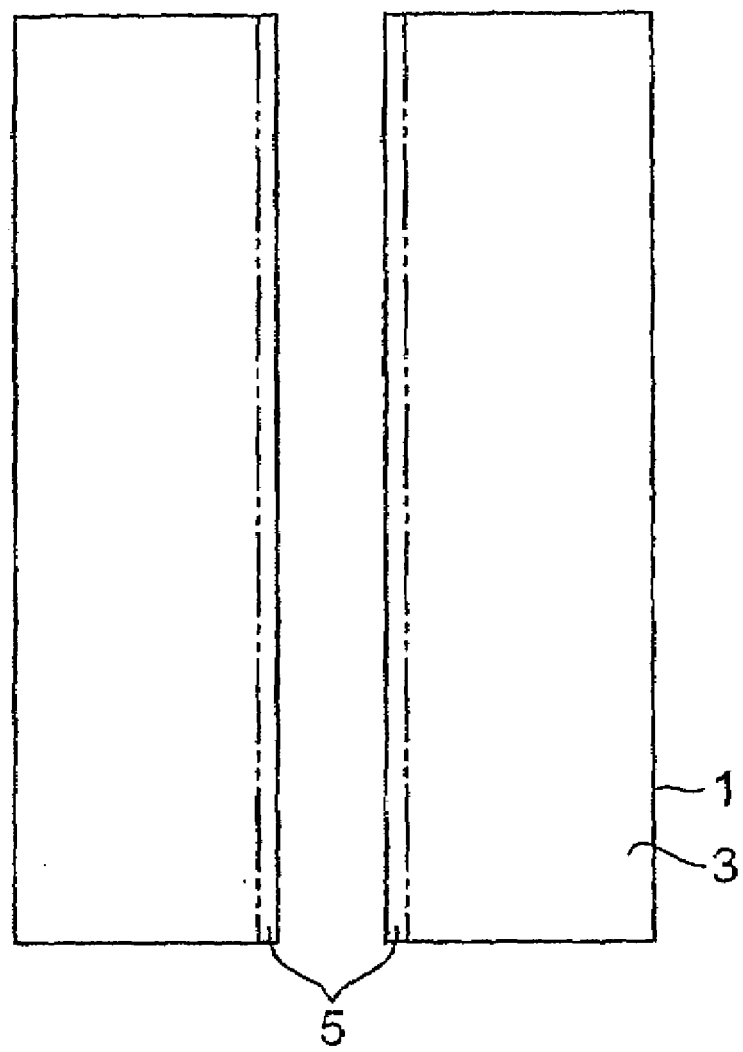
FIG. 6 is a plan view of the object cut by the laser processing method in accordance with the embodiment.

When the starting point region for cutting 8 is formed within the object 1, fractures are likely to start from the starting point region for cutting 8, whereby the object 1 can be cut with a relatively small force as shown in FIG. 6. Therefore, the object 1 can be cut with a high precision without generating unnecessary fractures greatly deviating from the line to cut 5 on the front face 3 of the object 1.

There seem to be the following two ways of cutting the object 1 from the starting point region for cutting 8 acting as the start point. The first case is where an artificial force is applied to the object 1 after forming the starting point region for cutting 8, so that the object 1 fractures from the starting point region for cutting 8, whereby the object 1 is cut. This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other case is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of modified region 7 when the object 1 has a small thickness, or if the starting point region for cutting 8 is formed by a plurality of rows of modified regions 7 in the thickness direction when the object 1 has a large thickness. Even in this naturally fracturing case, fractures do not extend onto the front face 3 at a portion corresponding to an area not formed with the starting point region for cutting 8, so that only the portion corresponding to the area formed with the starting point region for cutting 8 can be cleaved, whereby cleavage can be controlled well. Such a cleaving method with a favorable controllability is quite effective, since the object 1 such as silicon wafer has recently been apt to decrease its thickness.

The modified region formed by multiphoton absorption in the laser processing method in accordance with this embodiment encompasses the following cases (1) to (3):

(1) Case where the Modified Region is a Crack Region Including One Crack or a Plurality of Cracks An object to be processed (e.g., glass or a piezoelectric material made of $LiTaO_3$) is irradiated with laser light while locating a light-converging point therewithin under a condition with a field intensity of at least $1 \times 10^8$ (W/cm$^2$) at the light-converging point and a pulse width of 1 µs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1 \times 10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be Processed: Pyrex® Glass (with a Thickness of 700 µm)

(B) Laser light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: output <1 mJ/pulse
laser light quality: TEMoo
polarizing property: linear polarization (C) Condenser Lens transmittance at a laser light wavelength: 60%

(D) Moving Rate of the Mounting Table Mounting the Object: 100 mm/sec

The laser light quality of TEMoo means that the light-converging characteristic is so high that convergence to about the wavelength of laser light is possible.

Figure 7:
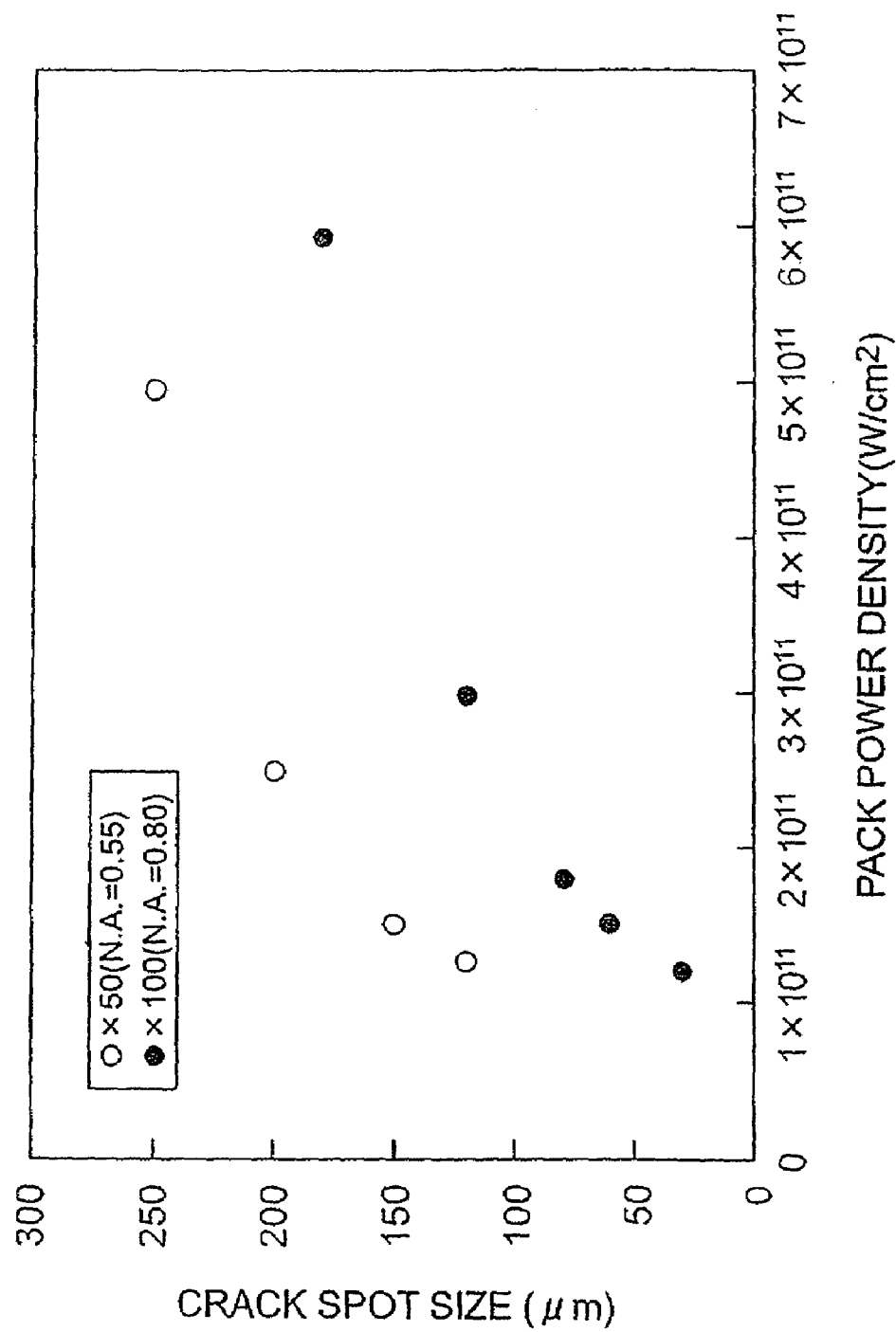
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
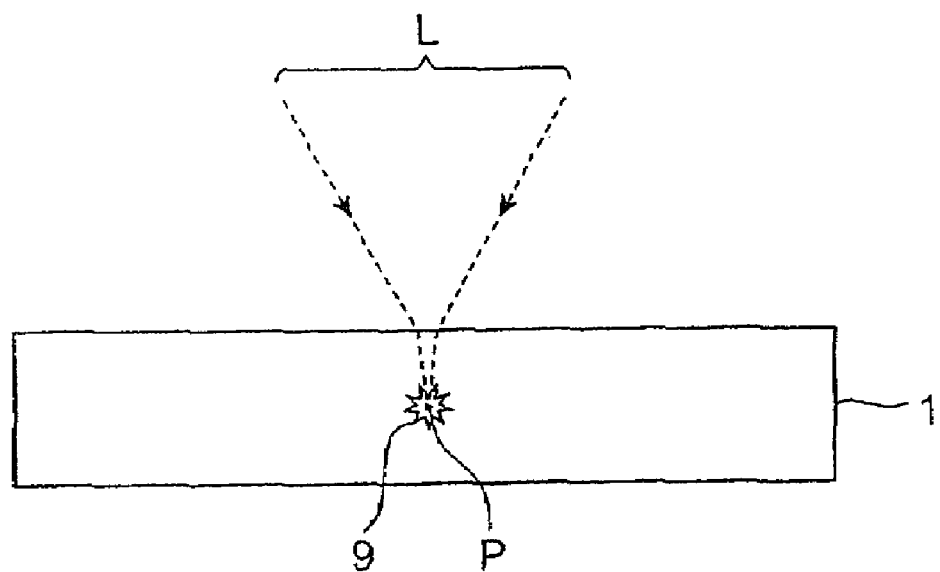
FIG. 8 is a sectional view of the object in a crack region forming step when cutting the object by using the laser processing method in accordance with the embodiment.
Figure 9:
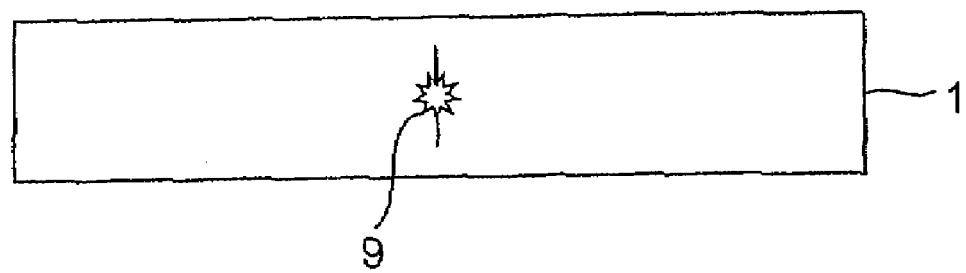
FIG. 9 is a sectional view of the object in a crack growing step when cutting the object by using the laser processing method in accordance with the embodiment.
Figure 10:
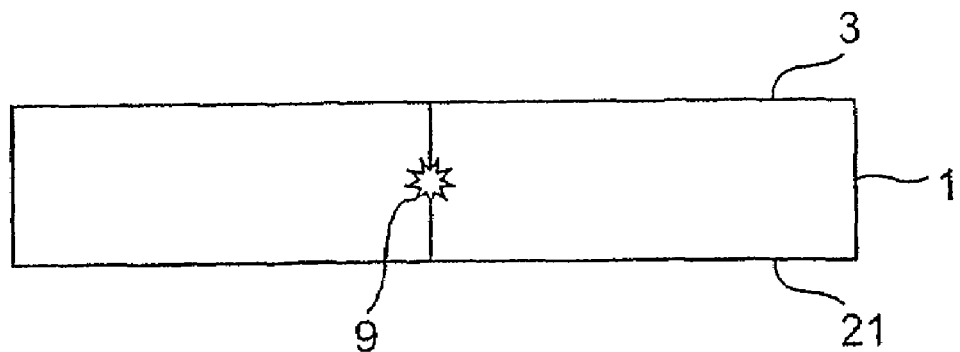
FIG. 10 is a sectional view of the object in the crack growing step when cutting the object by using the laser processing method in accordance with the embodiment.
Figure 11:
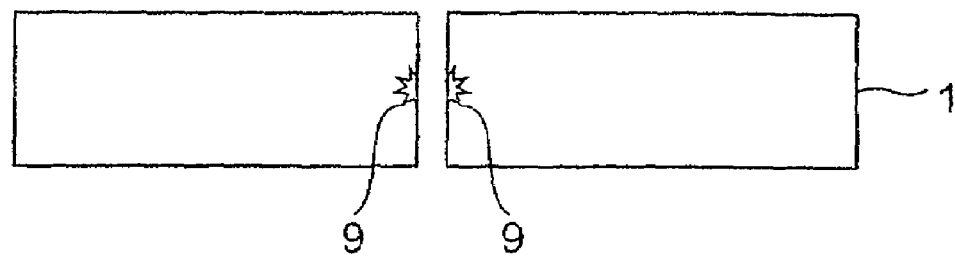
FIG. 11 is a sectional view of the object in a cutting step when cutting the object by using the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the light-converging point P is located within the object 1 under a condition where multiphoton absorption occurs, so as to form a crack region 9 therewithin along a line to cut. The crack region 9 is a region containing one crack or a plurality of cracks. Thus formed crack region 9 yields a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a light-converging point within the object under a condition with a field intensity of at least $1 \times 10^8$ (W/cm$^2$) at the light-converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure has changed to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 ns to 200 ns, for example. By an experiment, the inventors verified that a molten processed region was formed within a silicon wafer. The following are conditions of the experiment.

(A) Object to be Processed: Silicon Wafer (with a Thickness of 350 µm and an Outer Diameter of 4 Inches)

(B) Laser light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: 20 µJ/pulse
laser light quality: TEMoo
polarizing property: linear polarization (C) Condenser Lens magnification: ×50
N.A.: 0.55
transmittance at a laser light wavelength: 60%

(D) Moving Rate of the Mounting Table Mounting the Object: 100 mm/sec

Figure 12:
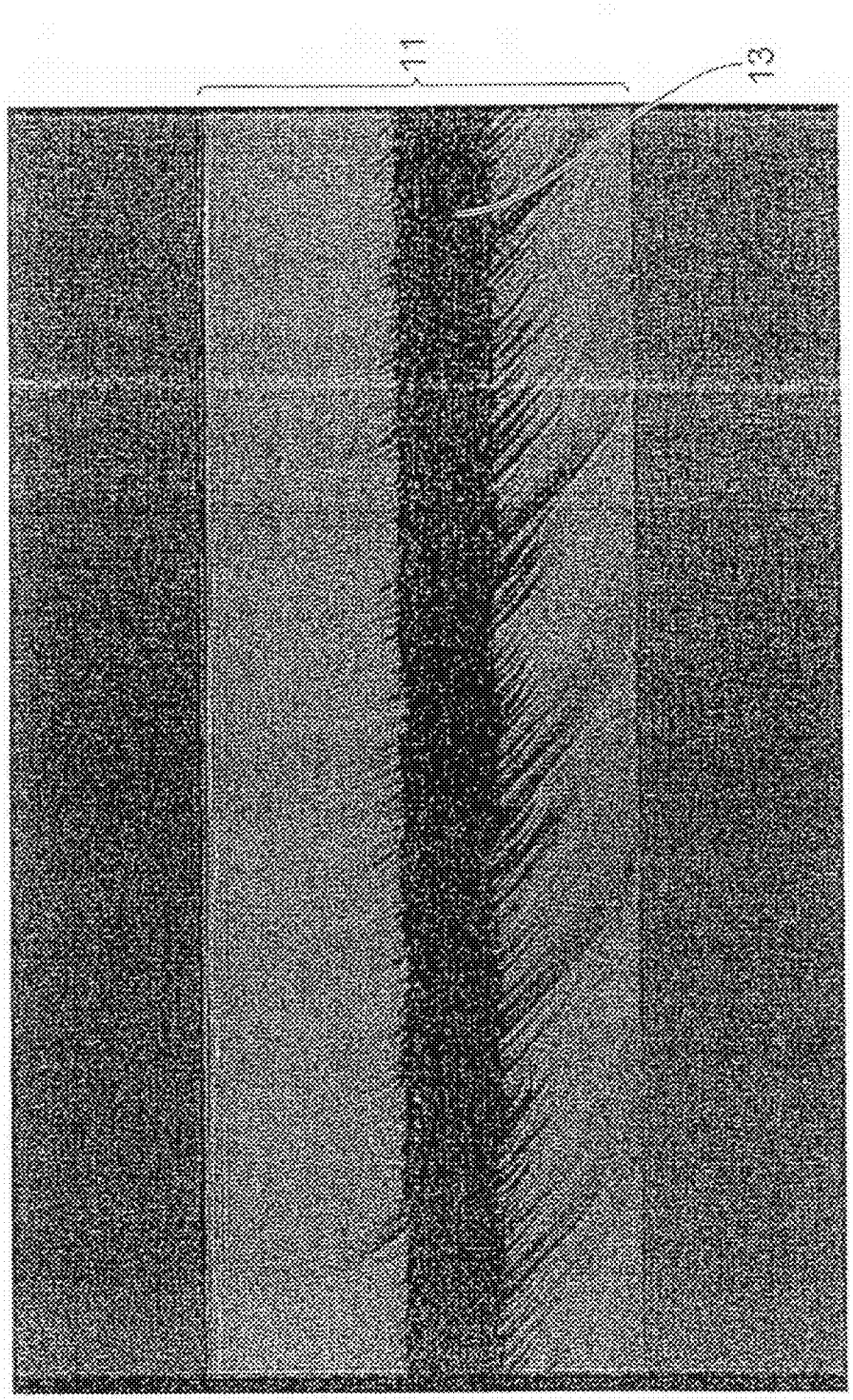
FIG. 12 is a view showing a photograph of a cross section of a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
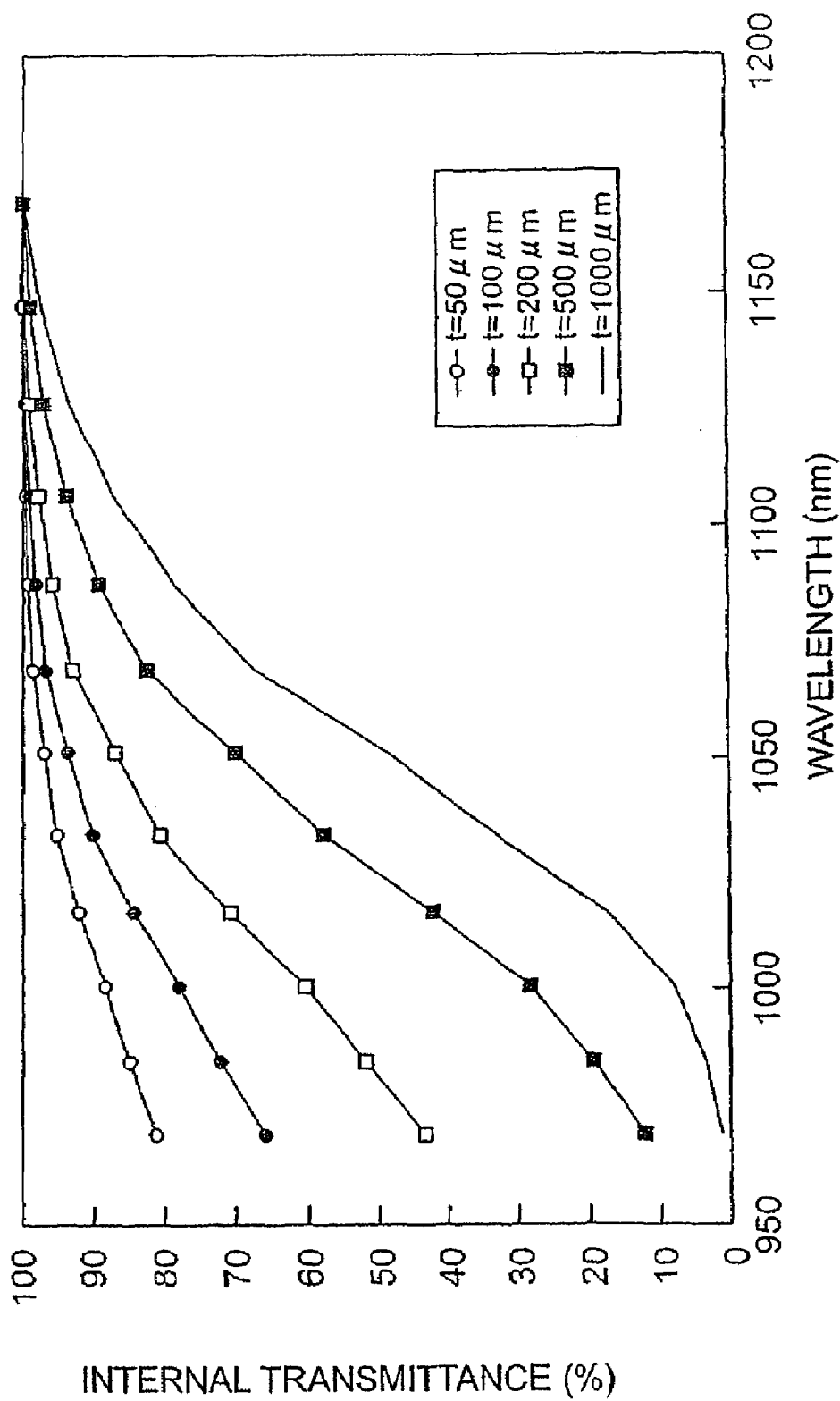
FIG. 13 is a graph showing relationships between the laser light wavelength and the transmittance within the silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, toward a cross section, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cross section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier.

(3) Case where the Modified Region is a Refractive Index Change Region

An object to be processed (e.g., glass) is irradiated with laser light while locating a light-converging point within the object under a condition with a field intensity of at least $1\times10^8$ (W/cm$^2$) at the light-converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1\times10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases (1) to (3) are explained in the foregoing as a modified region formed by multiphoton absorption, a starting point region for cutting may be formed as follows while taking account of the crystal structure of a wafer-like object to be processed, its cleavage characteristic, and so forth, whereby the object can be cut with a high precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a III-V family compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the direction to be formed with the starting point region for cutting, the starting point region for cutting extending in the direction to be formed therewith can be formed easily and accurately with reference to the orientation flat.

Figure 14:
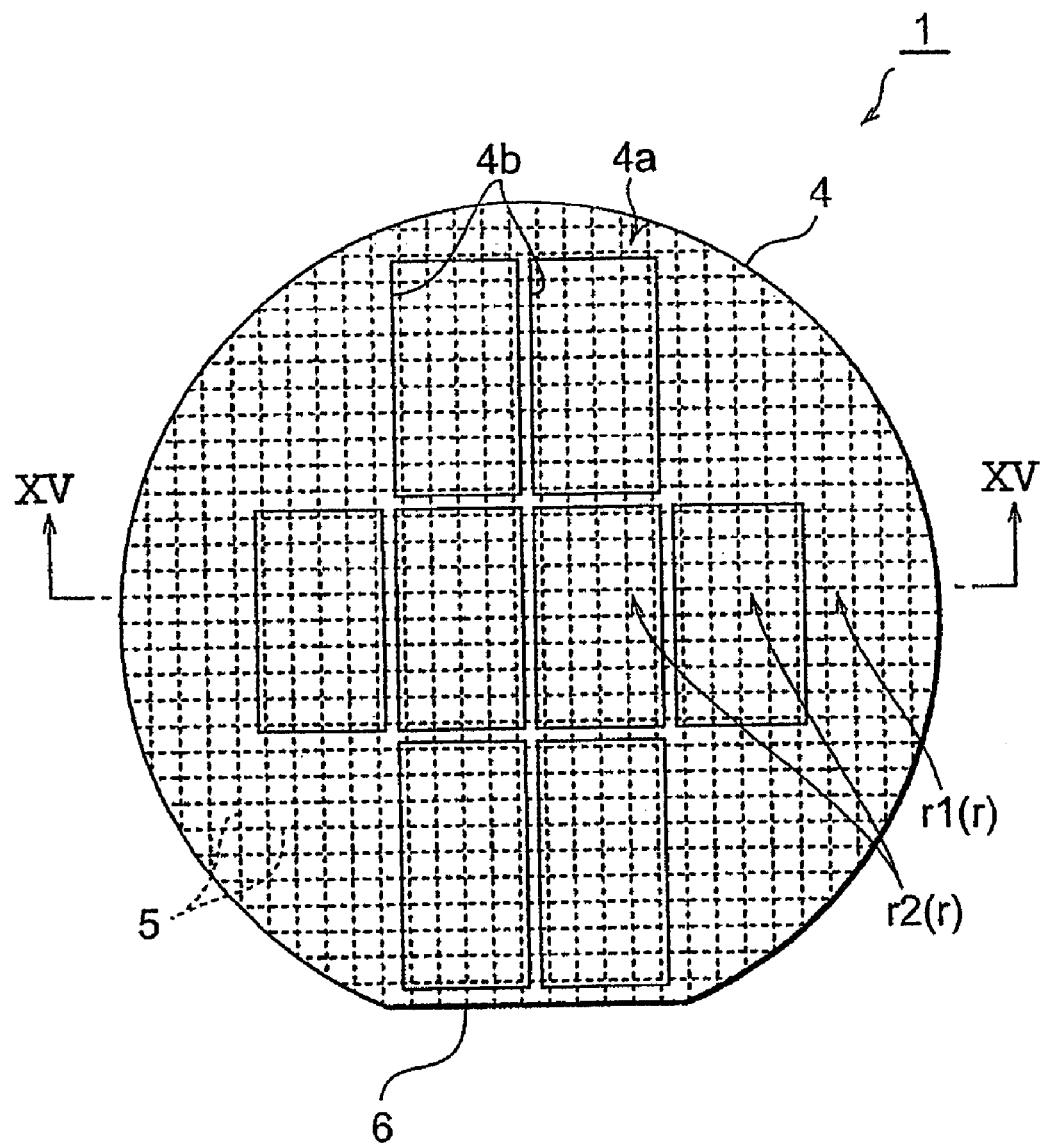
FIG. 14 is a plan view schematically showing an example of the object in the laser processing method of the embodiment.
Figure 15:
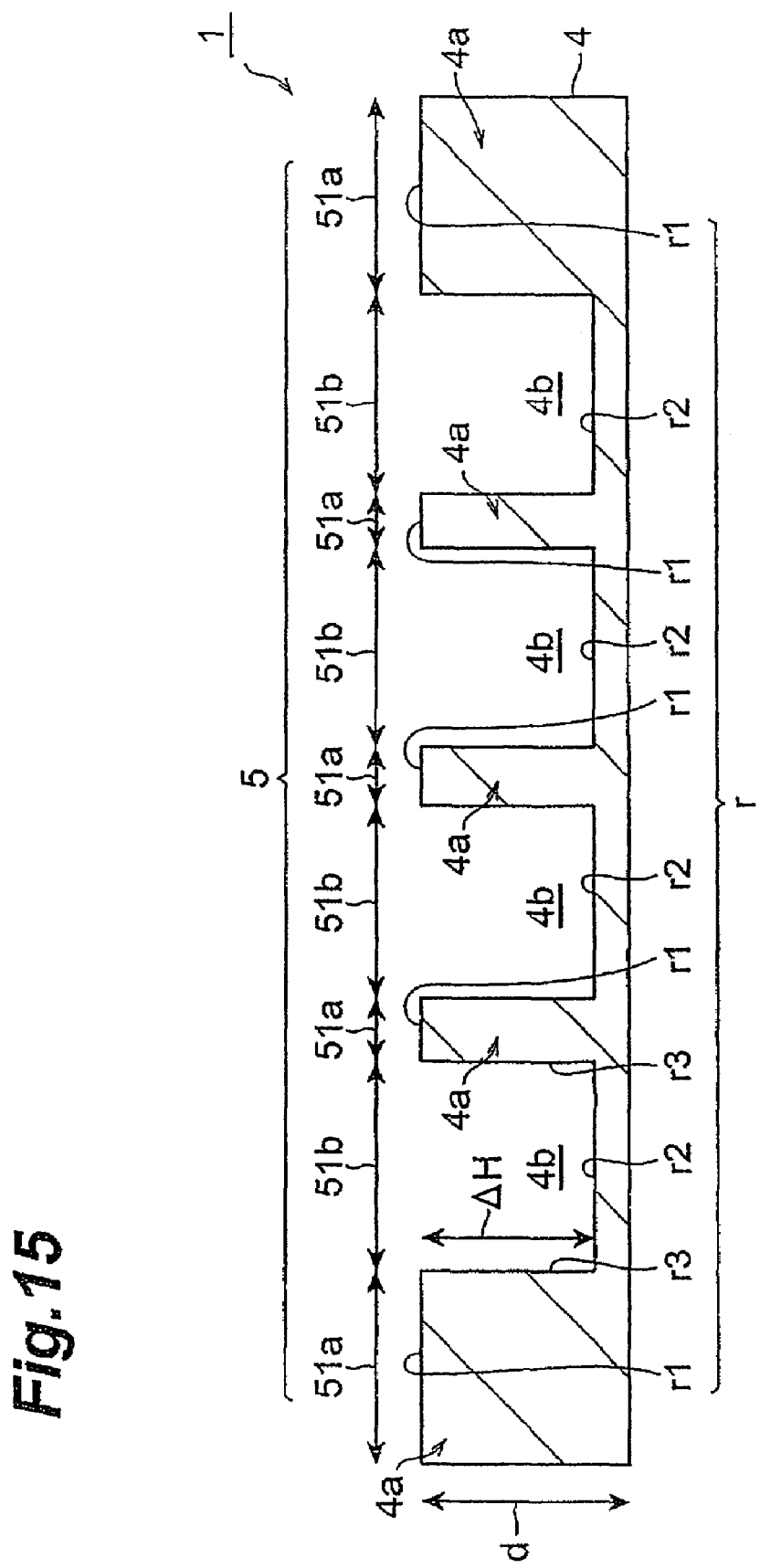
FIG. 15 is a sectional view taken along the line XV-XV of FIG. 14.
Figure 16:
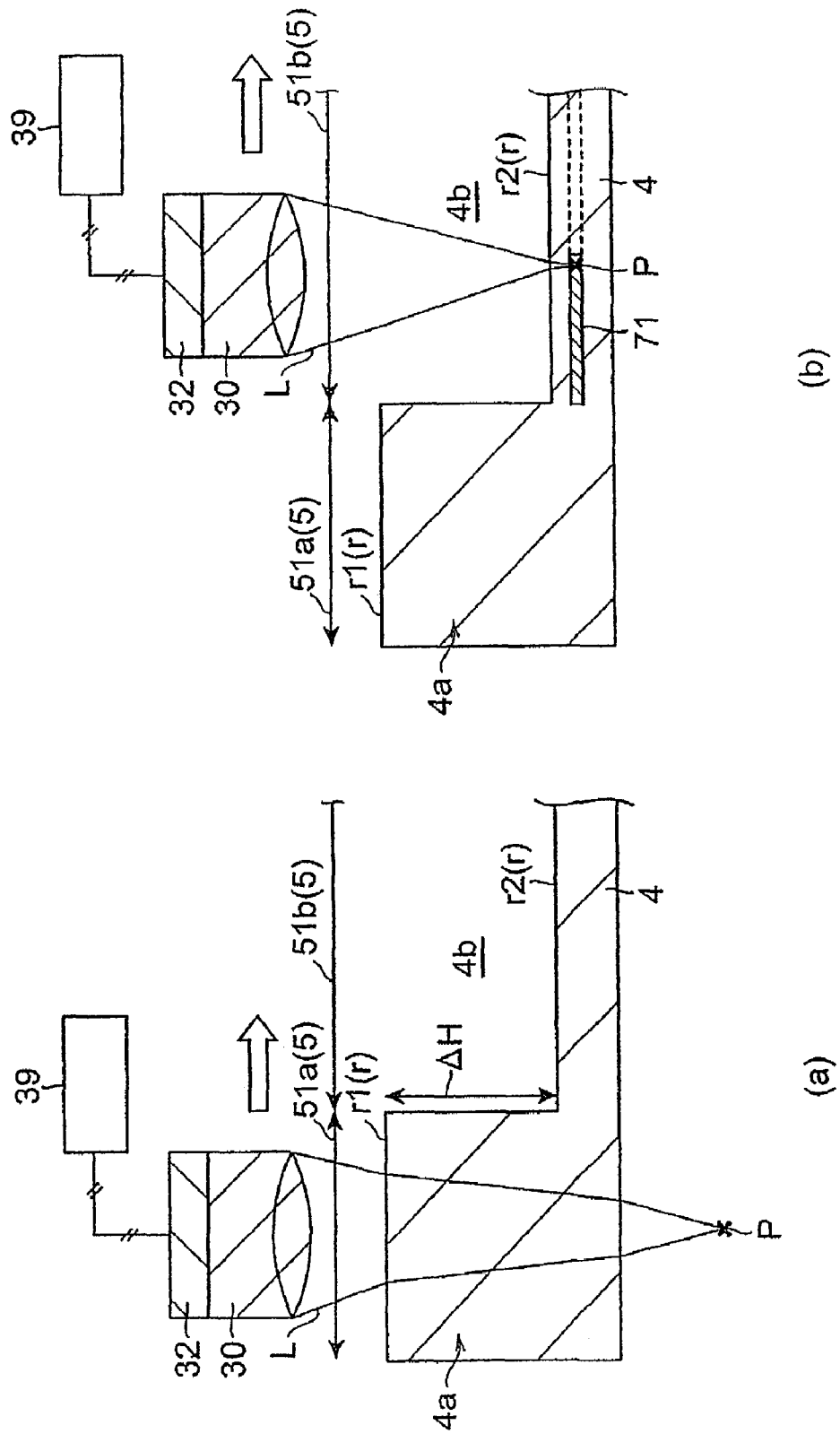
FIG. 16 is a partial sectional view of the object in a first step of the laser processing method in accordance with the embodiment.

The preferred embodiment of the present invention will now be explained. FIG. 14 is a plan view schematically showing an example of the object to be processed in the laser processing method of this embodiment. FIG. 15 is a sectional view taken along the line XV-XV of FIG. 14.

In this embodiment, the object to be processed 1 is constituted by a substrate 4 comprising protrusions 4a and depressions 4b positioned between the protrusions 4a, 4a. Examples of the object 1 include MEMS (Micro-Electro-Mechanical Systems). The thickness d of the substrate 4 is 300 μm, for example, at positions where the protrusions 4a exist, and 100 μm, for example, at positions where the depressions 4b exist. An example of the substrate 4 is a silicon wafer. In the object 1, the surface of the substrate 4 on the side of the projections 4a and depressions 4b is an entrance surface r for laser light L (processing laser light). The entrance surface r is an irregular surface comprising a protruded area surface r1 which is the top face of the projections 4a and a depressed area surface r2 which is the bottom face of the depressions 4b. The protruded area surface r1 corresponds to the top face of the protrusion 4a having a rectangular cross section, for example. The depressed area surface r2 corresponds to the bottom face of the depression 4b having a rectangular cross section, for example. A bump r3 extending in the thickness direction of the object 1 is provided between the depressed area surface r2 and projected area surface r1. The height ΔH of the protrusion (the height of the bump r3) is 200 μm, for example.

The object 1 such as a silicon wafer may be etched, so as to form the depressions 4b. The constituent material of the protrusions 4a may be either identical to or different from that of the part of the substrate 4 other than the protrusions 4a. For example, the protrusions 4a may be made of a silicon oxide, whereas the part of the substrate 4 other than the protrusions 4a may be made of silicon.

In the entrance surface r, dicing streets are formed like a grid over the depressed area surface r2 and projected area surface r1, whereas lines to cut 5 are set as virtual lines on the dicing streets. The lines to cut 5 are composed of a part 51a on the protruded area surface r1 and a part 51b on the depressed area surface r2. The lines to cut 5 are used for indicating portions to cut, whereas it is not necessary for the dicing streets to be formed on the object 1. The lines to cut 5 are constituted by lines parallel and perpendicular to the orientation flat 6 of the substrate 4, for example.

An example of the laser processing method in accordance with this embodiment for cutting thus constructed object 1 will now be explained. FIGS. 16 to 19 are partial sectional views of the object in or after individual steps of the laser processing method in accordance with this embodiment.

(First Step)

In the first step, at the time of irradiation with the laser light L along the part 51a on the protruded area surface r1 in the lines to cut 5, the laser light L is emitted while locating a light-converging point P on the outside of the substrate 4 as shown in FIG. 16(a). The light-converging point P is positioned below the surface of the substrate 4 opposite from the entrance surface r, for example. In this case, no modified region is formed within the substrate 4.

Figure 17:
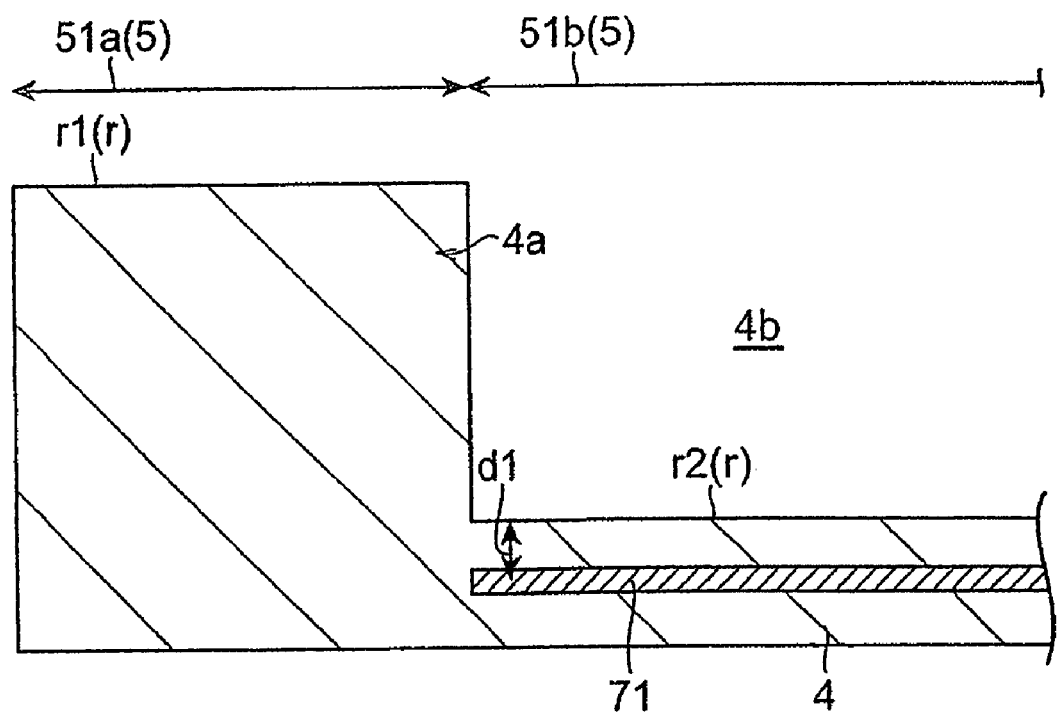
FIG. 17 is a partial sectional view of the object after the first step of the laser processing method in accordance with the embodiment.

At the time of irradiation with the laser light L along the part 51b on the depressed area surface r2 in the lines to cut 5, on the other hand, the laser light L is emitted while locating the light-converging point P within the substrate as shown in FIG. 16(b). Consequently, a modified region 71 (first modified region) to become a starting point region for cutting is formed within the substrate 4 along the part 51b on the depressed area surface r2 in the lines to cut 5 as shown in FIG. 17. The modified region 71 is formed inside by a distance d1 from the depressed area surface r2 in the thickness direction of the object 1.

As shown in FIGS. 16(a) and 16(b), the laser light L is converged by an objective lens 30 held by an actuator 32 made of a piezoelectric device or the like, for example. A controller 39 for regulating the actuator 32 is connected to the actuator 32. The controller 39 adjusts the amount of expansion/contraction of the actuator 32, and thus can regulate the position of light-converging point P in the thickness direction of the object 1. This can freely move the position of light-converging point P from the inside to the outside of the object 1 or vice versa. The position of light-converging point P also depends on the exit angle of the laser light L emitted from the objective lens 30, the thickness d of the substrate 4, and the refractive index of the constituent material of the substrate 4.

Here, at the time of irradiation with the laser light L along the part 51a on the protruded area surface r1 in the lines to cut 5 as shown in FIG. 16(a), it will be preferred if an irradiation condition of the laser light L is fixed. At the time of irradiation with the laser light L along the part 51b on the depressed area surface r2 in the lines to cut 5 as shown in FIG. 16(b), it will be preferred if the irradiation condition of the laser light L is changed so as to position the light-converging point P of laser light L inside by the distance d1 from the depressed area surface r2. An example of the irradiation condition of the laser light L is the position of the objective lens 30 in the thickness direction of the object 1. The position of the objective lens 30 is adjusted when the amount of expansion/contraction of the actuator 32 is regulated by the controller 39.

Specifically, at the time of irradiation with the laser light L along the part 51a on the protruded area surface r1 in the lines to cut 5 as shown in FIG. 16(a), for example, the actuator 32 is stopped expanding/contracting, so as to fix the objective lens 30 at a predetermined position in the thickness direction of the object 1, thereby reliably positioning the light-converging point P of laser light on the outside of the object 1. At the time of irradiation with the laser light L along the part 51b on the depressed area surface r2 in the lines to cut 5 as shown in FIG. 16(b), for example, the position of the objective lens 30 is displaced so as to follow fine irregularities and undulations (each being several to several tens of micrometers). This can form the modified region 71 at a fixed position inside by the distance d1 from the depressed area surface r2 along the part 51b on the depressed area surface r2 in the lines to cut 5. Namely, the modified region 71 is formed on the inside of the depressed area surface r2 so as to follow the displacement of the entrance surface r in the thickness direction of the object 1.

As mentioned above, it will be preferred if the irradiation condition of the laser light L is switched from the fixed state to the changed state or vice versa between the depressed area surface r2 and the protruded area surface r1, i.e., at the position of the bump r3. This makes it easier to reliably locate the light-converging point P on the outside of the object 1 at the time of irradiation with the laser light L along the part 51a on the protruded area surface r1 in the lines to cut 5. This is particularly effective when the protrusion 4a has a large height, i.e., a height ΔH of 100 μm or greater. When the entrance surface r has fine irregularities and undulations (each being several to several tens of micrometers), the position of the objective lens 30 can be adjusted (by an autofocus mechanism) in conformity to the displacement of the entrance surface r such that the modified region is formed at a position inside by a predetermined distance from the entrance surface r. When the height ΔH of the protrusion 4a is large, however, the driving amount and driving time for the actuator 32 increase so that it becomes harder to drive the objective lens 30 so as to make it follow the bump r3. In the first step of this embodiment, by contrast, the position of the objective lens 30 is set such that the light-converging point P is positioned within the object 1 (more preferably in the vicinity of the position where the modified region 71 is formed) in the depressed area surface r2, and such that the light-converging point P is positioned on the outside of the object 1 in the protruded area surface r1. This position is the fixed position of the objective lens 30 when the laser light L passes the protruded area surface r1, and is a reference position for driving the objective lens 30 by the actuator 32 so as to form the modified region 71 at a position inside by a fixed distance from the depressed area surface r2 following fine irregularities and undulations of the entrance surface r. Therefore, when moving the objective lens 30 from the depressed area surface r2 to the protruded area surface r1 or vice versa, it is not necessary for the objective lens 30 to move its position greatly for changing the objective lens 30 from a variable state to a fixed state or vice versa at the position of the bump r3 even if ΔH is large. Consequently, the objective lens 30 can smoothly move when passing over the bump r3, whereby the modified region 71 can be formed at an accurate position within the object 1.

Though one row of modified region 71 is formed in the first step in this embodiment, the number of rows of modified regions is not limited thereto. For example, two or more rows of modified regions may be formed.

(Second Step)

In the second step, at the time of irradiation with the laser light L along the part 51a on the protruded area surface r1 in the lines to cut 5 as shown in FIG. 18(a), the laser light L is emitted while locating the light-converging point P within the substrate 4. This forms a modified region 72 (second modified region), which becomes a starting point region for cutting, within the substrate 4 along the part 51a on the protruded area surface r1 in the lines to cut 5. The modified region 72 is formed inside by a distance d2 from the protruded area surface r1 in the thickness direction of the object 1.

At the time of irradiation with the laser light L along the part 51b on the depressed area surface r2 in the lines to cut 5 as shown in FIG. 18(b), on the other hand, the laser light L is emitted while locating the light-converging point P on the outside of the substrate 4. The light-converging point P is positioned above the entrance surface r of the substrate 4, for example. In this case, no modified region is formed within the substrate 4.

Here, at the time of irradiation with the laser light L along the part 51a on the protruded area surface r1 in the lines to cut 5 as shown in FIG. 18(a), it will be preferred if an irradiation condition of the laser light L is changed such that the light-converging point P of laser light L is positioned inside by the distance d2 from the protruded area surface r1. At the time of irradiation with the laser light L along the part 51b on the depressed area surface r2 in the lines to cut 5 as shown in FIG. 18(b), it will be preferred if the irradiation condition of the laser light L is fixed. An example of the irradiation condition of the laser light L is the position of the objective lens 30 in the thickness direction of the object 1. The position of the objective lens 32 is adjusted when the amount of expansion/contraction of the actuator 32 is regulated by the controller 39.

Specifically, at the time of irradiation with the laser light L along the part 51a on the protruded area surface r1 in the lines to cut 5 as shown in FIG. 18(a), for example, the position of the objective lens 30 is displaced so as to follow fine irregularities and undulations (each being several to several tens of micrometers). This can form the modified region 72 at a fixed position inside by the distance d2 from the protruded area surface r1 along the part 51a on the protruded area surface r1 in the lines to cut 5. Namely, the modified region 72 is formed on the inside of the protruded area surface r1 so as to follow the displacement of the entrance surface r in the thickness direction of the object 1. At the time of irradiation with the laser light L along the part 51b on the depressed area surface r2 in the lines to cut 5 as shown in FIG. 18(b), for example, the actuator 32 is stopped expanding/contracting, so as to fix the objective lens 30 at a predetermined position in the thickness direction of the object 1, thereby reliably positioning the light-converging point P of laser light on the outside of the object 1.

As mentioned above, it will be preferred if the irradiation condition of the laser light L is switched from the fixed state to the changed state or vice versa between the depressed area surface r2 and the protruded area surface r1, i.e., at the position of the bump r3. This makes it easier to reliably locate the light-converging point P on the outside of the object 1 at the time of irradiation with the laser light L along the part 51b on the depressed area surface r2 in the lines to cut 5. This is particularly effective when the protrusion 4a has a large height, i.e., a height ΔH of 100 μm or greater. When the entrance surface r has fine irregularities and undulations (each being several to several tens of micrometers), the position of the objective lens 30 can be adjusted (by an autofocus mechanism) in conformity to the displacement of the entrance surface r such that the modified region is formed at a position inside by a predetermined distance from the entrance surface r. When the height ΔH of the protrusion 4a is large, however, the driving amount and driving time for the actuator 32 increase so that it becomes harder to drive the objective lens 30 so as to make it follow the bump r3. In the second step of this embodiment, by contrast, the position of the objective lens 30 is set such that the light-converging point P is positioned within the object 1 (more preferably in the vicinity of the position where the modified region 72 is formed) in the protruded area surface r1, and such that the light-converging point P is positioned on the outside of the object 1 in the depressed area surface r2. This position is the fixed position of the objective lens 30 when the laser light L passes the depressed area surface r2, and is a reference position for driving the objective lens 30 by the actuator 32 so as to form the modified region 72 at a position inside by a fixed distance from the protruded area surface r1 following fine irregularities and undulations of the entrance surface r. Therefore, when moving the objective lens 30 from the depressed area surface r2 to the protruded area surface r1 or vice versa, it is not necessary for the objective lens 30 to move its position greatly for changing the objective lens 30 from a variable state to a fixed state or vice versa at the position of the bump r3 even if ΔH is large. Consequently, the objective lens 30 can smoothly move when passing over the bump r3, whereby the modified region 72 can be formed at an accurate position within the object 1.

Figure 19:
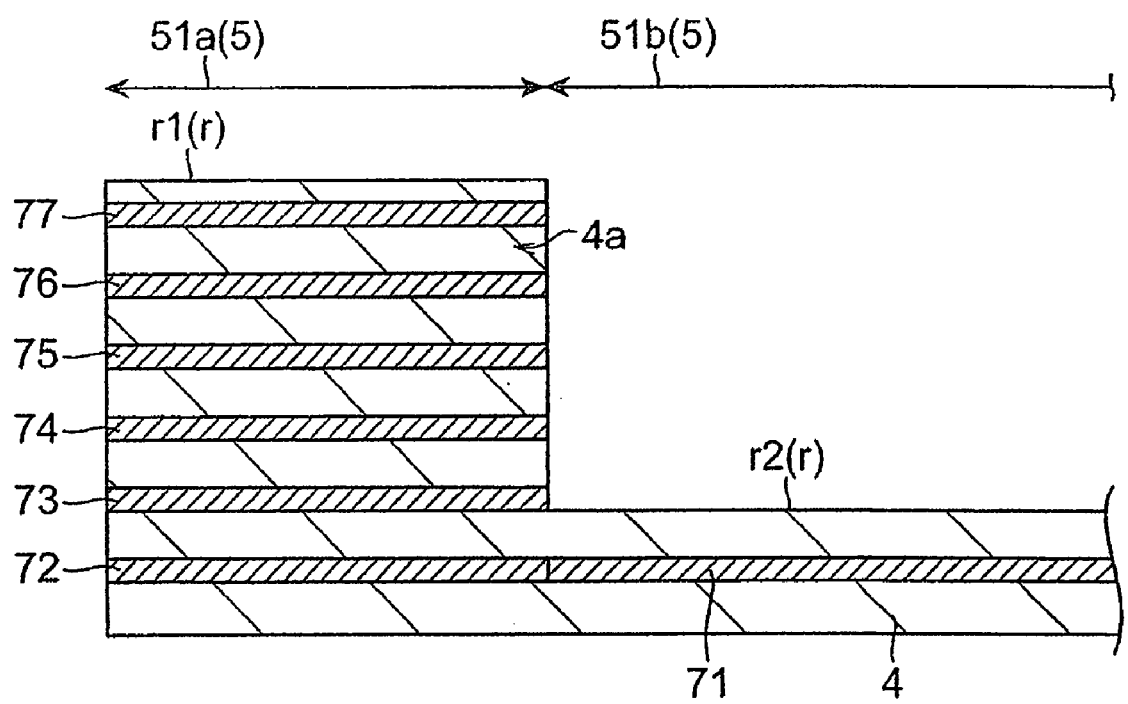
FIG. 19 is a partial sectional view of the object after the second step of the laser processing method in accordance with the embodiment.

Next, as shown in FIG. 19, modified regions 73 to 77 are successively formed toward the entrance surface r by the same method as that of forming the modified region 72. The modified regions 73 to 77 are formed along the part 51a on the protruded area surface r1 in the lines to cut 5. The modified regions 72 to 77 are arranged so as to be separated from each other in the thickness direction of the object 1.

Though six rows of modified regions 72 to 77 are formed in the second step in this embodiment, the number of rows of modified regions is not limited thereto. For example, only one row of modified region or two or more rows of modified regions may be formed. It will be preferred if the number of modified regions is set appropriately according to the height ΔH of the protrusion 4a.

As with the above-mentioned modified region 7, each of the modified regions 71 to 77 may be made of a continuously formed modified region or modified regions intermittently formed at predetermined intervals.

(Cutting Step)

After forming the modified regions 71 to 77, an expandable film such as expandable tape (not depicted) is attached to the object 1 and is expanded by an expander (not depicted), so as to cut the object 1 along the lines to cut 5 and separate the processed pieces from each other. The expandable film may be attached to the object 1 before forming the modified regions 71 to 77. In the cutting step, not only the expansion of the expandable film but other stress application means may be used for cutting the object 1. In the case where cracks started from the formed modified region have already reached the entrance surface r of the object and its surface opposite from the entrance surface r, thereby completing the cutting, for example, neighboring processed pieces are separated from each other so that the expansion of an expandable film such as expandable tape widens the gap between the processed pieces. Thus, the object 1 can highly accurately be cut along the lines to cut 5.

In the laser processing method in accordance with this embodiment, as explained in the foregoing, the modified regions 71, 72 are formed within the object 1 in the depressed area surface r2 and protruded area surface r1 of the entrance surface r in different steps, respectively. Therefore, when the lines to cut 5 extend over the depressed area surface r2 and protruded area surface r1 of the entrance surface r, the modified region 71 can be formed highly accurately inside by the distance d1 from the depressed area surface r2 in the first step, and the modified region 72 can be formed highly accurately inside by the distance d2 from the protruded area surface r1 in the second step. Consequently, the laser processing method in accordance with this embodiment can highly accurately cut the object 1 whose entrance surface r for the laser light L is an irregular surface.

The entrance surface r may be irradiated with measurement laser light, so as to determine the position of the bump r3 from reflected light of the measurement laser light. Specifically, an astigmatic signal or total light quantity signal is detected by a quadrant position detecting device used in an astigmatic method, for example. The position of the bump r3 can be determined according to the astigmatic signal or total light quantity signal. For example, the arrival at the position of the bump r3 can be determined when the astigmatic signal of the reflected light exceeds a predetermined threshold or when the total light quantity signal of the reflected light exceeds a predetermined threshold. When the light-converging point of measurement laser light is positioned at the entrance surface r, the astigmatic signal becomes substantially zero while the total light quantity signal of reflected light is maximized.

If the position of the bump r3 is seen, a timing for moving the light-converging point P of laser light L from the inside to outside of the object 1 or vice versa can be determined at the time of shifting the laser light L along the lines to cut 5. The actuator 32 can determine a timing for changing or fixing the position of the objective lens 30 in the thickness direction of the object 1.

Though the preferred embodiment of the present invention is explained in detail in the foregoing, the present invention is not limited thereto.

For example, the order of performing the first and second steps is not limited in particular. For instance, the first step may be performed after the second step. The modified region 71 may be formed after forming the modified regions 72 to 77.

The moving direction of the laser light L is not restricted in particular in any of the first and second steps. For example, the laser light L may be emitted along the part 51b on the depressed area surface r2 in the lines to cut 5 after along the part 51a on the protruded area surface r1 in the lines to cut 5 or vice versa.

In any of the first and second steps, the objective lens 30 may be moved greatly in the thickness direction of the object 1, for example, when moving the position of the light-converging point P from the inside to outside of the object 1 or vice versa at the position of the bump r3. This is particularly effective when the height ΔH of the protrusion 4a is small.

In any of the first and second steps, laser light having such an energy as to make it easier to form a modified region may be used when the light-converging point P is positioned within the object 1, while laser light having such an energy as to make it harder to form a modified region may be used when the light-converging point P is positioned on the outside of the object 1. This makes it possible to further reduce damages caused by laser light L in the part within the object 1 other than the part formed with the modified region. When laser light L is pulse-oscillated, for example, laser light L having such an energy as to make it easier to form a modified region can be obtained. When laser light L is continuously oscillated, for example, laser light having such an energy as to make it harder to form a modified region can be obtained.

The order of forming the modified regions 71 to 77 is not restricted in particular. For example, the modified regions 77, 76, 75, 74, 73, 72, and 71 may be formed in succession. Successively forming the modified regions 72 to 77 toward the entrance surface r can prevent the laser light L from being blocked by the already formed modified regions.

The modified regions 71 to 77 are not limited to those formed by multiphoton absorption generated within the object 1. The modified regions 71 to 77 may be formed by causing photoabsorption on a par with multiphoton absorption within the object 1.

The distance d1 between the depressed area surface r2 and the modified region 71 and the distance d2 between the protruded area surface r1 and the modified region 72 may be either identical to each other or different from each other.

The position of the bump r3 in the entrance surface r may be measured beforehand by a surface profiler, for example. The position of the bump r3 may also be calculated from designed values of the object 1. After the position of the bump r3 is seen, scale coordinates of a stage mounting the object 1 may be taken into a control apparatus for the laser light L, so as to move the light-converging point P of laser light from the inside to outside or vice versa at the position of the bump r3. Also, the irradiation condition of the laser light L may be switched from the variable state to the fixed state or vice versa at the position of the bump r3.

While forming the modified regions 71 to 77 along the lines to cut 5, the entrance surface r may be irradiated with measurement laser light, and its reflected light may be measured, so as to determine the position of the bump r3 from a change in the reflected light.

Though a semiconductor wafer made of silicon is used as the object 1 in this embodiment, the material of the semiconductor wafer is not limited thereto. Examples of the semiconductor wafer include group IV element semiconductors other than silicon, compound semiconductors containing group IV elements such as SiC, compound semiconductors containing group III-V elements, compound semiconductors containing group II-VI elements and semiconductors doped with various dopants (impurities). The object 1 may also be an SOI (silicon-on-insulator) in which an insulating layer is provided between a semiconductor device and a support substrate.

INDUSTRIAL APPLICABILITY

The present invention can provide a laser processing method which enables highly accurate cutting of a planar object to be processed having an irregular surface as an entrance surface for processing laser light.

The invention claimed is:

1. A laser processing method of irradiating a planar object to be processed with processing laser light while locating a light-converging point within the object so as to form a modified region to become a starting point region for cutting within the object along a line to cut the object;

the method comprising, when an entrance surface of the processing laser light in the object is an irregular surface while the line to cut extends over a depressed area surface and a protruded area surface in the entrance surface:

a first step of forming a first modified region inside by a predetermined distance from the depressed area surface along the line to cut; and a second step of forming a second modified region inside by a predetermined distance from the protruded area surface along the line to cut;

wherein, in the first step, the light-converging point is located outside the object at the time of irradiation with the processing laser light along a part on the protruded area surface in the line to cut; and wherein, in the second step, the light-converging point is located outside the object at the time of irradiation with the processing laser light along a part on the depressed area surface in the line to cut.

2. A laser processing method according to claim 1, wherein, in the first step, an irradiation condition of the processing laser light is changed so as to position the light-converging point of the processing laser light inside by a predetermined distance from the depressed area surface at the time of irradiation with the processing laser light along a part on the depressed area surface in the line to cut, and is fixed at the time of irradiation with the processing laser light along a part on the protruded area surface in the line to cut; and wherein, in the second step, the irradiation condition of the processing laser light is changed so as to position the light-converging point of the processing laser light inside by a predetermined distance from the protruded area surface at the time of irradiation with the processing laser light along a part on the protruded area surface in the line to cut, and is fixed at the time of irradiation with the processing laser light along a part on the depressed area surface in the line to cut.

3. A laser processing method according to claim 1, wherein, after forming the first and second modified regions, the object is cut along the line to cut.

4. A laser processing method according to claim 2, wherein, in the first and second steps, the irradiation condition of the processing laser light is changed so as to adjust position the lens where the processing laser light is converged to a displacement of the entrance surface of the processing laser light; and wherein, in the first and second steps, the irradiation condition of the processing laser light is fixed so as to fix position the lens.

5. A laser processing method according to any one of claims 1 to 4, wherein, in the first and second steps, when the light-converging point is positioned within the object to be processed, the processing laser light is pulse-oscillated; and wherein, in the first and second steps, when the light-converging point is positioned outside the object to be processed, the processing laser light is continuously oscillated.

6. A method of manufacturing a semiconductor device of irradiating a planar object to be processed which is a semiconductor wafer with processing laser light while locating a light-converging point within the object so as to form a modified region to become a starting point region for cutting within the object along a line to cut the object, and cut the object along the line to cut from the starting point region so as to manufacture a semiconductor device;

the method comprising, when an entrance surface of the processing laser light in the object is an irregular surface while the line to cut extends over a depressed area surface and a protruded area surface in the entrance surface;

a first step of forming a first modified region inside by a predetermined distance from the depressed area surface along the line to cut; and a second step of forming a second modified region inside by a predetermined distance from the protruded area surface along the line to cut;

wherein, in the first step, the light-converging point is located outside the object at the time of irradiation with the processing laser light along a part on the protruded area surface in the line to cut; and wherein, in the second step, the light-converging point is located outside the object at the time of irradiation with the processing laser light along a part on the depressed area surface in the line to cut.

7. A method of manufacturing a semiconductor device according to claim 6, wherein, in the first step, an irradiation condition of the processing laser light is changed so as to position the light-converging point of the processing laser light inside by a predetermined distance from the depressed area surface at the time of irradiation with the processing laser light along a part on the depressed area surface in the line to cut, and is fixed at the time of irradiation with the processing laser light along a part on the protruded area surface in the line to cut; and wherein, in the second step, the irradiation condition of the processing laser light is changed so as to position the light-converging point of the processing laser light inside by a predetermined distance from the protruded area surface at the time of irradiation with the processing laser light along a part on the protruded area surface in the line to cut, and is fixed at the time of irradiation with the processing laser light along a part on the depressed area surface in the line to cut.

8. A method of manufacturing a semiconductor device according to claim 7, wherein, in the first and second steps, the irradiation condition of the processing laser light is changed so as to adjust position the lens where the processing laser light is converged to a displacement of the entrance surface of the processing laser light; and wherein, in the first and second steps, the irradiation condition of the processing laser light is fixed so as to fix position the lens.

9. A method of manufacturing a semiconductor device according to any one of claims 6 to 8, wherein, in the first and second steps, when the light-converging point is positioned within the object to be processed, the processing laser light is pulse-oscillated; and wherein, in the first and second steps, when the light-converging point is positioned outside the object to be processed, the processing laser light is continuously oscillated.

* * * * *